United States Patent
Sakamoto

(10) Patent No.: US 6,897,546 B1
(45) Date of Patent: May 24, 2005

(54) SEMICONDUCTOR DEVICE INCLUDING A FUNCTIONAL ELEMENT HAVING A PN JUNCTION

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/070,536

(22) PCT Filed: Sep. 6, 2000

(86) PCT No.: PCT/JP00/06035
§ 371 (c)(1),
(2), (4) Date: Jul. 2, 2002

(87) PCT Pub. No.: WO01/20683
PCT Pub. Date: Mar. 22, 2001

(30) Foreign Application Priority Data

Sep. 9, 1999 (JP) ............................. 11-255881

(51) Int. Cl.[7] ..................... H01L 27/082; H01L 29/861; H01L 27/102
(52) U.S. Cl. ..................... 257/577; 257/104; 257/592
(58) Field of Search ............... 257/565, 570, 257/577, 592, 104, 106, 551, 474, 471, 476, 477, 478, 481, 484, 603, 105, 162

(56) References Cited

U.S. PATENT DOCUMENTS 4,871,686 A * 10/1989 Davies ..................... 437/39
4,933,740 A * 6/1990 Baliga et al. ............ 257/162

FOREIGN PATENT DOCUMENTS

| JP | 47-3015 | 2/1972 | |
| JP | UM58-58361 | 4/1983 | |
| JP | 58-66356 | 4/1983 | |
| JP | 62-58678 | 3/1987 | |
| JP | 0532481 | * 3/1993 | ............ 257/355 |
| JP | 07-312370 | 11/1995 | |

* cited by examiner

Primary Examiner—Steven Loke
(74) Attorney, Agent, or Firm—Rabin & Berdo, P.C.

(57) ABSTRACT

A semiconductor device which can suppress an electronic breakdown. In the semiconductor device, a base electrode is connected to a base region in a base contact region defined on a surface of the base region. An N-type region having the same conductivity type as an emitter region is provided beneath a boundary portion of the base contact region to surround the base contact region. In other words, a PN-type diode constituted by the P-type base region and the N-type region is provided beneath the boundary portion of the base contact region.

4 Claims, 6 Drawing Sheets

SEMICONDUCTOR DEVICE INCLUDING A FUNCTIONAL ELEMENT HAVING A PN JUNCTION

This application is the national phase of PCT International Application No. PCT/JP00/06035 filed on Sep. 6, 2000 under 35 U.S.C. § 371.

TECHNICAL FIELD

The present invention relates to a semiconductor device including a functional element having a PN junction.

BACKGROUND ART

Conventionally available bipolar transistors, in principle, have a construction as shown in FIG. 7. That is, a P-type base region 92 is provided in a surface portion of an N-type semiconductor substrate 91, and an N-type emitter region 93 is provided in the P-type base region 92. The base region 92 and the emitter region 93 are connected to a base electrode 94 and an emitter electrode 95, respectively. A collector electrode is connected to an $N^+$-type region 96 provided on a back side of the N-type semiconductor substrate 91. Denoted by 97 is an insulation film.

The base region 92 is formed by implanting a P-type impurity into the N-type semiconductor substrate 91 from the surface of the substrate. Therefore, the concentration of the impurity in the base region 92 gradually increases toward the surface, so that a base-emitter current flow concentrates in a subsurface portion of the base region 92. Accordingly, the subsurface portion of the base region 92 is more susceptible to an electric breakdown attributable to heat generation due to power consumption than the other portion of the base region 92. This causes reduction in electrostatic breakdown resistance, inductive load resistance and resistive load resistance of the entire bipolar transistor.

DISCLOSURE OF THE INVENTION

It is an object of the present invention to provide a semiconductor device which can suppress an electric breakdown.

The semiconductor device of the present invention comprises a functional element having a first conductivity type semiconductor region provided in a semiconductor substrate, and a second conductivity type semiconductor region provided in contact with the first conductivity type semiconductor region and having a conductivity type different from that of the first conductivity type semiconductor region. A diode is provided in a boundary portion of a contact region to which an electrode is connected in the first conductivity type semiconductor region.

With the arrangement according to the present invention, the diode is provided in the boundary portion of the contact region, whereby an electric current flowing in the first conductivity type semiconductor region can be prevented from concentrating in a subsurface portion of the first semiconductor region. Thus, an electric breakdown of the subsurface portion of the first semiconductor region can be suppressed for improvement in breakdown resistance.

More specifically, the diode may be a PN diode constituted by the first conductivity type semiconductor region and a second conductivity type region embedded in the first conductivity type semiconductor region in contact with a boundary of the contact region and having a conductivity type different from that of the first conductivity type semiconductor region. In this case, majority carriers in the first conductivity type semiconductor region mostly bypass the second conductivity type region to move from the electrode connected to the first conductivity type semiconductor region toward the second conductivity type semiconductor region.

Where the functional element is an NPN-type bipolar transistor, for example, abase current flowing in a P-type base region as the first conductivity type semiconductor region mostly bypasses a subsurface portion of the base region formed with an N-type region as the second conductivity type region to flow toward an emitter region as the second conductivity type semiconductor region. This prevents the current flow from concentrating in the subsurface portion of the base region. As a result, an electric breakdown of the subsurface portion of the base region can be suppressed. Since a portion of the N-type region contacts a base electrode, minority carriers (electrons) remaining in the base region can be taken into the N-type region during a switching operation. This suppresses accumulation of electrons in the base region, thereby speeding up the switching operation.

Further, a high-concentration impurity region having the same conductivity type as the first conductivity type semiconductor region may be provided in contact with the electrode in the contact region. In this case, the diode may be a Schottky diode having a Schottky junction formed by the electrode connected to the contact region and the first conductivity type semiconductor region. In this case, majority carriers in the first conductivity type semiconductor region mostly move from the electrode connected to the first conductivity type semiconductor region through the high-concentration region and spread from the high-concentration region to move toward the second conductivity type semiconductor region.

Where the functional element is an NPN-type bipolar transistor, for example, a base current flowing in a P-type base region as the first conductivity type semiconductor region mostly passes through a $P^+$-type region as the high-concentration region and spreads from the $P^+$-type region to flow toward an emitter region as the second conductivity type semiconductor region. Thus, the base current spreads in the base region to flow toward the emitter region. Therefore, the current flow can be prevented from concentrating in a subsurface portion of the base region. As a result, an electric breakdown of the subsurface portion of the base region can be suppressed. Further, minority carriers (electrons) remaining in the base region can speedily be released through the Schottky junction. This suppresses accumulation of the minority carriers in the base region, thereby speeding up a switching operation.

The foregoing and other objects, features and effects of the present invention will become more apparent from the following description of the embodiments with reference to the attached drawings.

EMBODIMENTS OF THE INVENTION

With reference to the attached drawings, the present invention will hereinafter be described in detail by way of several embodiments thereof, in which the invention is applied to a semiconductor device having an NPN-type bipolar transistor.

Figure 1:
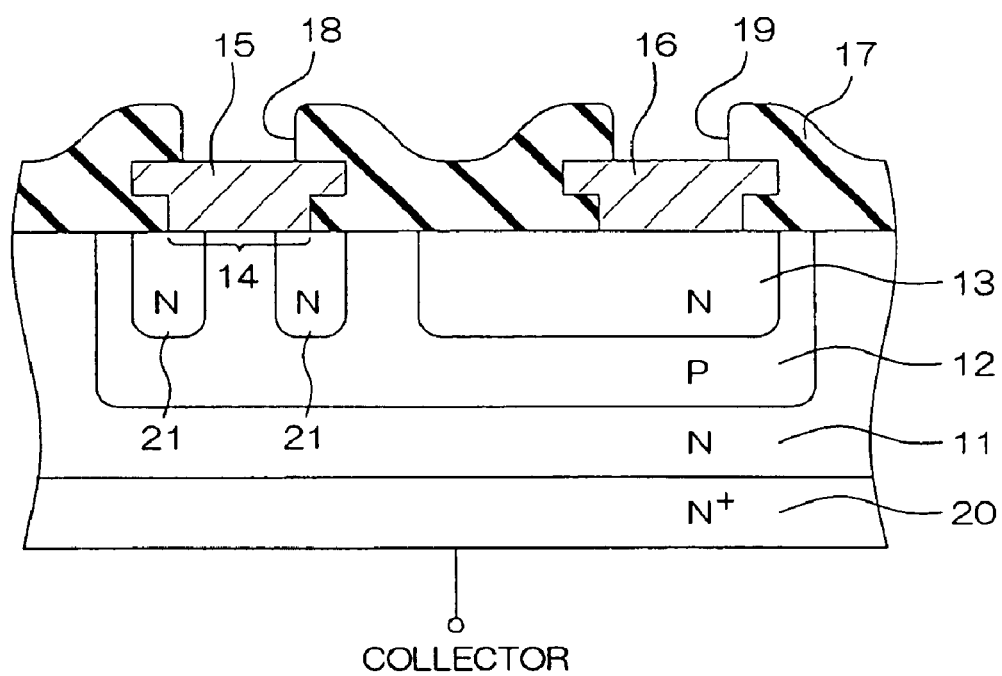
FIG. 1 is a sectional view illustrating the construction of a bipolar transistor according to one embodiment of the present invention.
Figure 2:
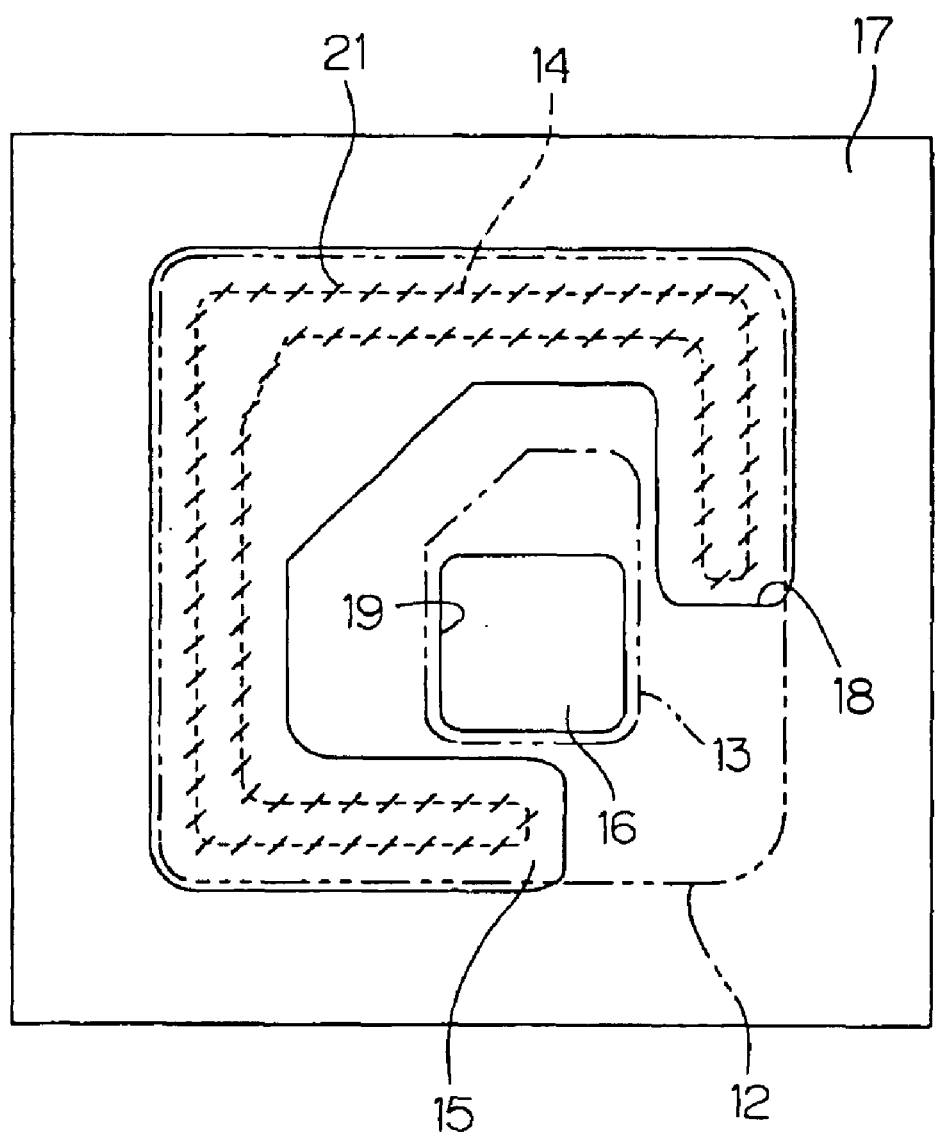
FIG. 2 is a plan view illustrating the surface configuration of a semiconductor device having the bipolar transistor.

FIG. 1 is a sectional view illustrating the construction of a bipolar transistor according to one embodiment of the present invention. FIG. 2 is a plan view illustrating the surface configuration of a semiconductor device having the bipolar transistor. A P-type base region 12 is provided in a surface portion of an N-type semiconductor substrate 11. An N-type emitter region 13 is provided in the P-type base region 12. Thus, an NPN structure is provided, and the N-type semiconductor substrate 11 serves as a collector region.

A base contact region 14 having, for example, a generally C-shape as viewed in plan is defined on the surface of the base region 12, and a base electrode 15 is connected to the base region 12 in the base contact region 14. An emitter electrode 16 is connected to the emitter region 13. The base electrode 15 and the emitter electrode 16 are respectively exposed from openings 18 and 19 formed in an insulation film 17, and a base wire and an emitter wire (not shown) are respectively bonded to exposed portions of the base electrode and the emitter electrode for external electrical connection. A collector electrode is connected to an N⁺-type region 20 provided on the back side of the semiconductor substrate 11.

An N-type region 21 having the same conductivity type as the emitter region 13 is provided in a boundary portion of the base contact region 14 to entirely surround the base contact region 14. In other words, the P-type base region 12 and the N-type region 21 constitute a PN-type diode in the boundary portion of the base contact region 14. In FIG. 2, the N-type region 21 is hatched.

With this arrangement, holes as majority carriers in the base region 12 move from the base electrode 15 through a portion of the base region surrounded by the N-type region 21 and then down around the N-type region 21 toward the emitter region 13. In other words, a base current flowing in the base region 12 bypasses a subsurface portion of the base region 12 formed with the N-type region 21 to flow toward the emitter region 13. This prevents the current flow from concentrating in the subsurface portion of the base region 12. As a result, an electric breakdown of the subsurface portion of the base region 12 can be suppressed.

Further, a portion of the N-type region 21 contacts the base electrode 15, so that minority carriers (electrons) remaining in the base region 12 can be taken into the N-type region 21 during a switching operation. This suppresses accumulation of the minority carriers in the base region 12, thereby speeding up the switching operation.

Figure 3A:
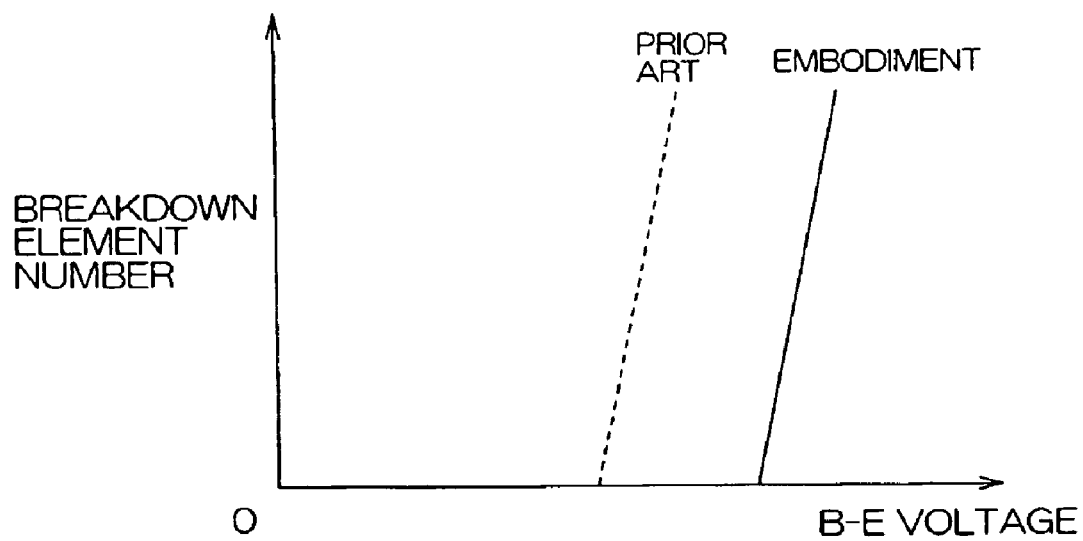
FIGS. 3A and 3B are diagrams illustrating the results of an electrostatic breakdown test performed on the bipolar transistor according to the embodiment and the prior-art bipolar transistor.
Figure 3B:
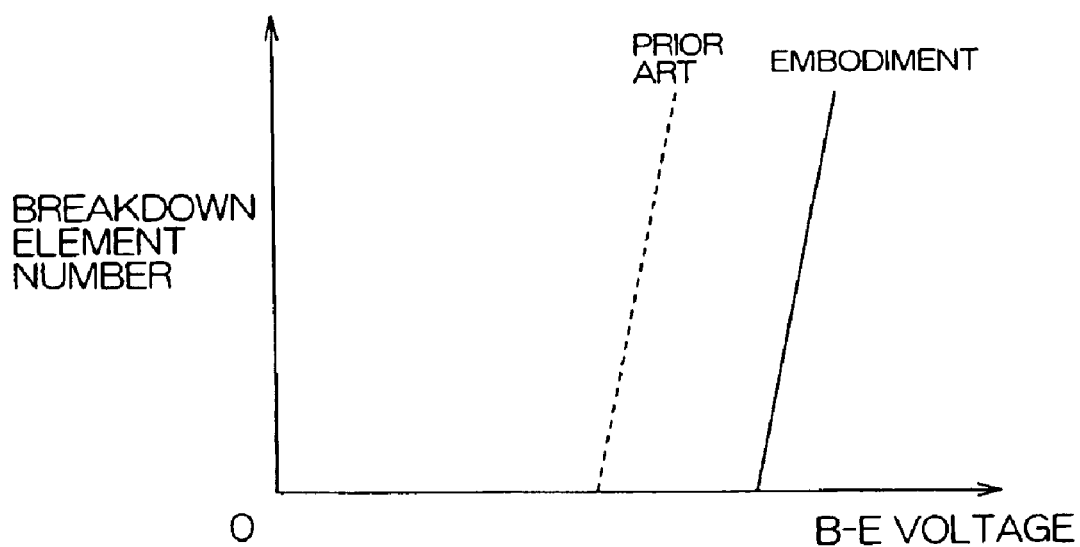

FIGS. 3A and 3B are diagrams illustrating the results of an electrostatic breakdown test performed on the bipolar transistor according to this embodiment and the prior-art bipolar transistor.

In the electrostatic breakdown test, a voltage was applied to a capacitor (e.g., 200 pF) connected to the base electrode 15 via a resistor (e.g., 1 kΩ) for accumulation of charges, and then the charges accumulated in the capacitor were released to cause an electric current to flow between a collector (C) and a base (B) and between the base (B) and an emitter (E). Then, the number of elements broken down in the test (broken element number) is counted. FIGS. 3A and 3B illustrate, as the results of the electrostatic breakdown test, a relationship between the base-emitter voltage (voltage applied by the capacitor) and the broken element number observed when a forward bias was applied between the base and the emitter, and a relationship between the base-emitter voltage and the broken element number observed when a reverse bias was applied between the base and the emitter, respectively. The results for the bipolar transistor of this embodiment are indicated by solid lines, and the results for the prior-art bipolar transistor are indicated by broken lines.

As can be understood from the results of the electrostatic breakdown test, the minimum base-emitter voltage (breakdown voltage) at which an electrostatic breakdown occurred in the bipolar transistor of this embodiment when the forward bias and the reverse bias were each applied between the base and the emitter is 1.5 times the breakdown voltage of the prior-art bipolar transistor. That is, it is understood that the bipolar transistor of this embodiment has an improved breakdown resistance as compared with the prior-art bipolar transistor.

Figure 4:
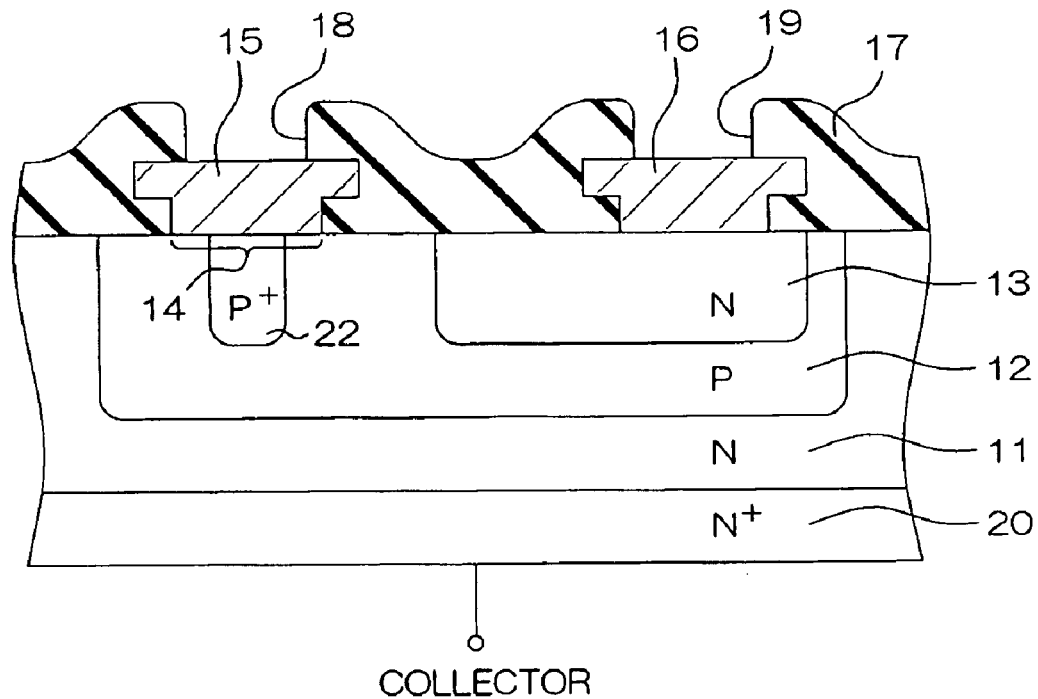
FIG. 4 is a sectional view illustrating the construction of a bipolar transistor according to another embodiment of the present invention.

FIG. 4 is a sectional view illustrating the construction of a bipolar transistor according to another embodiment of the present invention. In FIG. 4, parts corresponding to those shown in FIG. 1 will be denoted by the same reference characters as in FIG. 1. In this embodiment, a P⁺-type region 22 having a smaller width than the base contact region 14 is provided in a middle portion of the base contact region 14. On the lateral sides of the P⁺-type region 22, a Schottky junction is formed by the base electrode 15 and the P-type base region 12. With this Schottky junction, a Schottky diode is provided in the boundary portion of the base contact region 14.

With this arrangement, holes as majority carriers in the base region 12 move from the base electrode 15 through the P⁺-type region 22 and spread from the P⁺-type region 22 to move toward the emitter region 13. Thus, a base current spreads in the base region 12 and flows toward the emitter region 13. Therefore, the current flow can be prevented from concentrating in the subsurface portion of the base region 12 as in the first embodiment. As a result, the electric breakdown of the subsurface portion of the base region 12 can be suppressed.

Further, minority carriers (electrons) remaining in the base region 12 are speedily released through the Schottky junction. This suppresses the accumulation of the minority carriers in the base region 12 as in the first embodiment, thereby speeding up the switching operation.

Figure 5:
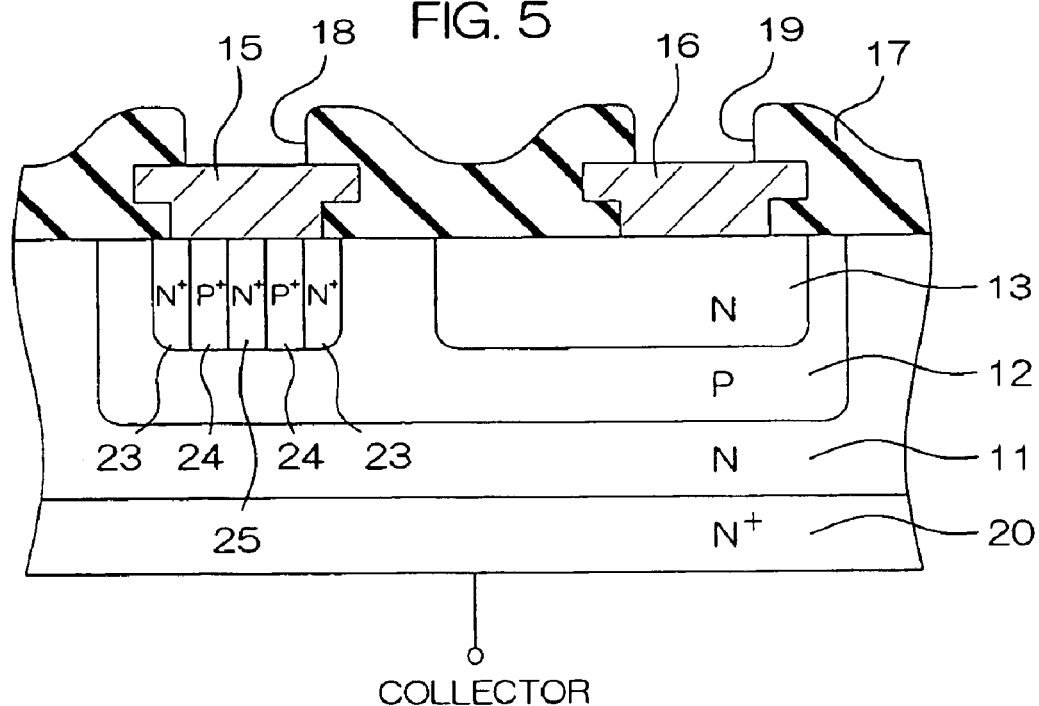
FIG. 5 is a sectional view illustrating the construction of a bipolar transistor according to further another embodiment of the present invention.

FIG. 5 is a sectional view illustrating the construction of a bipolar transistor according to further another embodiment of the present invention. In FIG. 5, parts corresponding to those shown in FIG. 1 are denoted by the same reference characters as in FIG. 1. In this embodiment, an N⁺-type region 23 having a small width is provided in the boundary portion of the base contact region 14 to surround the base contact region 14. P⁺-type regions 24 and an N⁺-type region 25 each having a small width are alternately provided in a region surrounded by the N⁺-type region 23. That is, a universal contact structure is provided in the base contact region 14.

With this arrangement, holes as majority carriers in the base region 12 move from the base electrode 15 through the P$^+$-type regions 24 and then down around the N$^+$-type region 23 toward the emitter region 13. This prevents the current flow from concentrating in the subsurface portion of the base region 12 as in the first embodiment. As a result, the electric breakdown of the subsurface portion of the base region 12 can be suppressed. Further, minority carriers remaining in the base region 12 are taken into the N$^+$-type regions 23, 25, whereby the accumulation of electrons in the base region 12 can effectively be suppressed as in the first embodiment.

Figure 6:
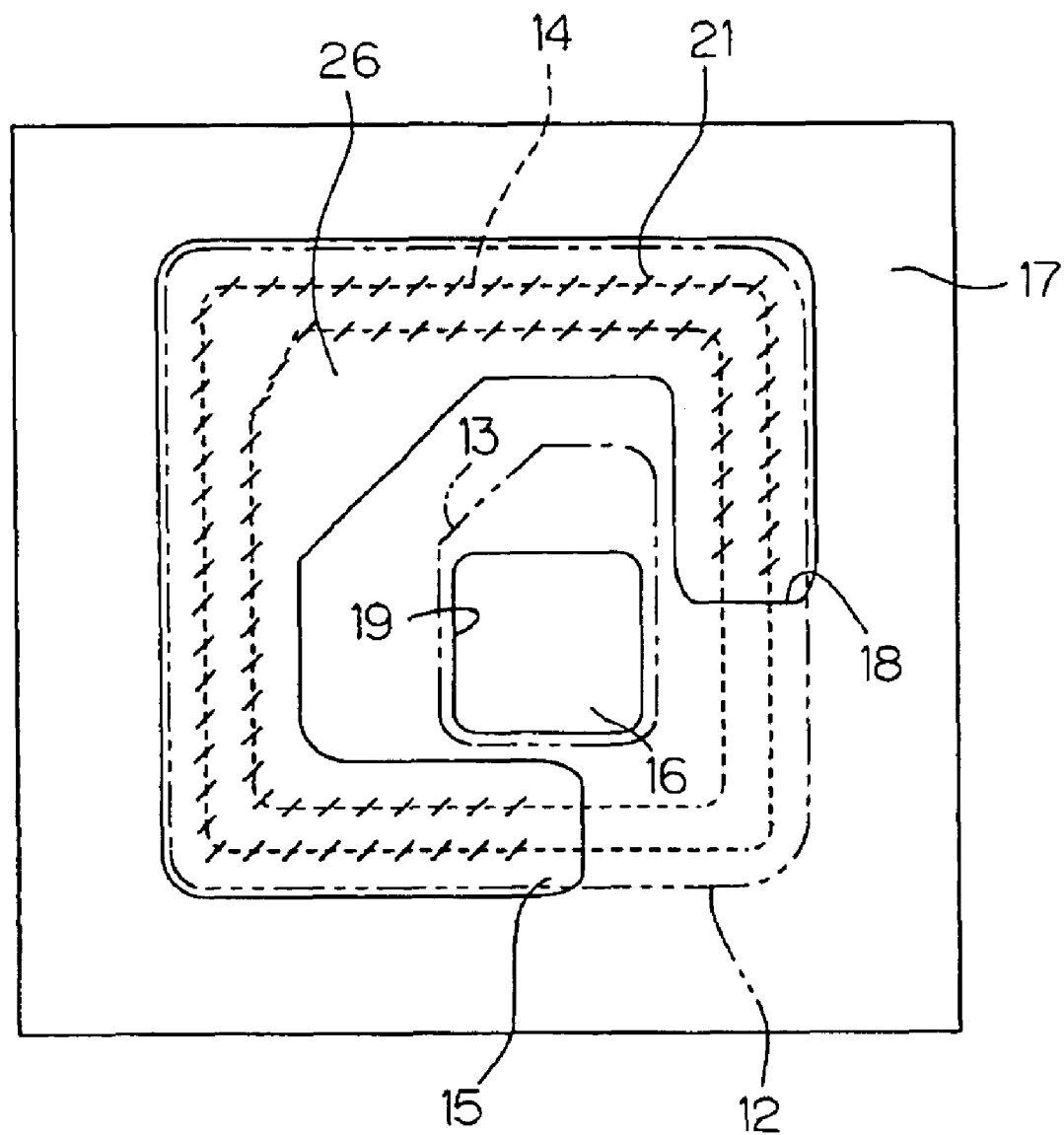
FIG. 6 is a plan view for explaining a modification of the embodiments.
Figure 7:
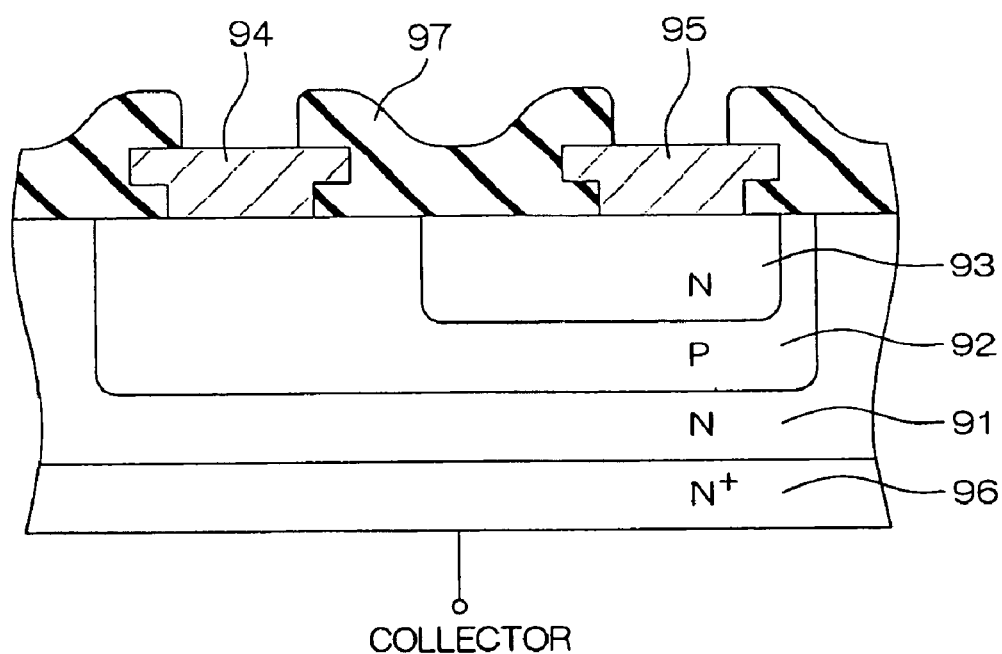
FIG. 7 is a sectional view illustrating the construction of the prior-art bipolar transistor.

While the three embodiments of the present invention have thus been described, the present invention may be embodies in any other forms. Although the contact region 14 having a generally C-shape as viewed in plan is provided in the embodiments described above, the base contact region 14 may have a ring shape as shown in FIG. 6 to surround the emitter region 13.

Further, the N-type region 21 and the N$^+$-type region 23 are not necessarily required to be each provided in the entire boundary portion of the base contact region 14. Where a base wire (not shown) is to be bonded to a bonding region 26 defined on the surface of the base electrode 15 as shown in FIG. 6, for example, the N-type region 21 and the N$^+$-type region 23 may each be provided only in a part closer to the bonding region 26, but not in a part relatively remote from the bonding region 26. Alternatively, the N-type region 21 and the N$^+$-type region 23 may each be provided only in a part of the boundary portion of the base contact region 14 closer to the emitter region 13.

Although the NPN-type bipolar transistor is taken as an example in the embodiments described above, the present invention is applicable to a PNP-type bipolar transistor. In this case, a P-type region or a P$^+$-type region having the same conductivity type as the emitter region is provided in the boundary portion of the base contact region defined in the N-type base region, or a P$^+$-type region having a smaller width than the base contact region is provided in the middle portion of the base contact region.

Although the semiconductor device having the single bipolar transistor is taken as an example in the embodiments described above, the present invention is applicable to a semiconductor device having a plurality of bipolar transistors. Further, the invention is applicable to a semiconductor device including a functional element other than the bipolar transistor, such as a thyristor, triac or a GTO (gate turn-off thyristor), which has a PN junction.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 11-255881 filed to the Japanese Patent office on Sept. 9, 1999, the disclosure thereof being incorporated herein by reference.

What is claimed is:

1. A semiconductor device, comprising
   a functional element having a first conductivity type semiconductor region provided in a semiconductor substrate, and a second conductivity type semiconductor region provided in contact with the first conductivity type semiconductor region and having a conductivity type different from that of the first conductivity type semiconductor region,
   wherein a diode is provided in a boundary portion of a contact region to which an electrode is connected in the first conductivity type semiconductor region, the diode including a second conductivity type region embedded in the first conductivity type semiconductor region in a region crossing over a boundary of the contact region, the second conductivity type region having a conductivity type different from that of the first conductivity type semiconductor region, the second conductivity type region being in contact with the electrode in the contact region, and
   wherein the functional element is a bipolar transistor which comprises a base region defined by the first conductivity type semiconductor region, and an emitter region defined by the second conductivity type semiconductor region.

2. A semiconductor device as set forth in claim 1, wherein a universal contact structure including the second conductivity type region is provided in contact with the electrode.

3. A semiconductor device, comprising:
   a functional element having a first conductivity type semiconductor region provided in a semiconductor substrate, and a second conductivity type semiconductor region provided in contact with the first conductivity type semiconductor region and having a conductivity type different from that of the first conductivity type semiconductor region,
   wherein a diode is provided in a boundary portion of a contact region to which an electrode is connected in the first conductivity type semiconductor region,
   wherein the contact region has a generally C-shape or a ring shape which surrounds the second conductivity type semiconductor region on the surface of the first conductivity type semiconductor region, and
   wherein a bonding region is defined on the first conductivity type semiconductor region for bonding a wire to the electrode, and the diode is provided at least in a part of the boundary portion of the contact region adjacent to the bonding region.

4. A semiconductor device, comprising
   a functional element having a first conductivity type semiconductor region provided in a semiconductor substrate, and a second conductivity type semiconductor region provided in contact with the first conductivity type semiconductor region and having a conductivity type different from that of the first conductivity type semiconductor region,
   wherein a diode is provided in a boundary portion of a contact region to which an electrode is connected in the first conductivity type semiconductor region,
   wherein the contact region has a generally C-shape or a ring shape which surrounds the second conductivity type semiconductor region on the surface of the first conductivity type semiconductor region, and
   wherein the functional element is a bipolar transistor which comprises a base region defined by the first conductivity type semiconductor region, and an emitter region defined by the second conductivity type semiconductor region.

* * * * *